United States Patent
Shibuya et al.

Patent Number: 5,497,024
Date of Patent: Mar. 5, 1996

[54] GAAS MIS DEVICE

[75] Inventors: Akira Shibuya, Narashino; Kazuo Hattori, 1-3, Uehara, Ogasaki-cho, Toyohashi-shi, Aichi; Masashi Ozeki, Tsukuba, all of Japan

[73] Assignees: Asahi Kogyosha Co., Ltd., Tokyo; Kazuo Hattori, Toyohashi; Fujitsu Limited, Kawasaki, all of Japan

[21] Appl. No.: 223,501

[22] Filed: Apr. 5, 1994

[30]     Foreign Application Priority Data

Jun. 8, 1993 [JP] Japan .................... 5-137214

[51] Int. Cl.⁶ ............................ H01L 23/58; H01L 29/76
[52] U.S. Cl. .................... 257/410; 257/289; 257/631
[58] Field of Search .................... 257/632, 635, 257/289, 410, 631

[56]          References Cited

U.S. PATENT DOCUMENTS 4,017,881  4/1977  Ono et al. ................... 257/98
4,078,980  3/1978  Harris et al. ................ 204/129.3
4,165,471  8/1979  Ahrenkeil ................... 257/289

*Primary Examiner*—Robert P. Limanek
*Assistant Examiner*—David Hardy
*Attorney, Agent, or Firm*—Armstrong, Westerman, Hattori, McLeland, & Naughton

[57]          ABSTRACT

A combination of a semiconductor region essentially consisting of $Al_xGa_{1-x}As$ ($0 \leq x \leq 1$), an insulating film formed on the surface of the semiconductor region and essentially consisting of $GaAs_wP_yO_z$ (w, y, z>0), and a passivation film formed on the insulating film and made of an insulating material different from the insulating film. The laminated insulating film has an extremely low leakage current. An excellent MISFET can be realized by forming a gate electrode on the surface of the laminated insulating film.

16 Claims, 5 Drawing Sheets

GAAS MIS DEVICE

BACKGROUND OF THE INVENTION

1. Field of the Invention

The present invention relates to a semiconductor device and a method of manufacturing the same, and more particularly to a semiconductor device having an insulating film of superior properties formed on the surface of $Al_xGa_{1-x}As$ ($0 \leq x \leq 1$) and a method of manufacturing the same.

2. Description of the Related Art

Forming insulating films of superior properties on $Al_xGa_{1-x}As$ surface has been impossible heretofore. A metal/insulator/semiconductor (MIS) structure of such fine properties as obtained by Si MIS integrated circuit technique has been impossible in the case of $Al_xGa_{1-x}As$.

An MIS structure is one of the fundamental structures of semiconductor devices. The properties of an MIS structure depend on the characteristics of an insulating film itself. Further, they depend greatly on the properties of an interface between an insulating film and semiconductor, particularly on the concentration of the interface states.

An Si MIS structure has excellent properties in terms of interface state density, leakage current, trap concentration in insulator, reliability, and the like because a Si insulating film provides ideal properties, having thus contributed much to the development of integrated circuit devices.

A good MIS structure for the typical III-V compound semiconductor GaAs is still not available in spite of intensive studies over a long period of 20 years or more.

Absence of a good MIS structure is a main obstacle against the development of various GaAs devices. An advent of a good MIS structure has long been desired by device designers, developers, and other engineers.

in GaAs MIS structures developed to date, most of insulating films have been silicon oxide ($SiO_x$) films, silicon oxynitride ($SiO_xN_y$) films, and GaAs oxide films (Ga oxide and As oxide).

Each of these MIS structures has a number of interface states at the interface of an insulating film and a GaAs layer. Several abnormalities in the electric characteristics of the MIS structure have been observed.

FIGS. 5A and 5B show the capacitance-voltage (C-V) characteristics of conventional MIS diodes which use GaAs oxide films as insulating films, the abscissa representing an applied voltage V and the ordinate representing a capacitance pF.

The sample used for the measurement of FIG. 5A shows no change in the capacitance relative to an applied voltage. Since the width of a depletion layer on the semiconductor surface of the sample does not change, it is almost impossible to manufacture MIS field effect transistors.

The sample used for the measurement of FIG. 5B shows a large hysteresis of the C-V characteristic, and large frequency dispersion is observed on the accumulation side. It is difficult for such samples to obtain a definite response to an applied voltage. Since the frequency characteristic is not good, it is very difficult to obtain high speed semiconductor devices.

Most of conventional MIS insulating films have been associated with a large diode leakage current. A poor insulating performance is not suitable for gate insulating films, nor for surface passivation films.

It is considered that the above-described abnormalities result from a number of traps in an insulating film and from a high concentration of the interface states between an insulating film and GaAs.

SUMMARY OF THE INVENTION

It is an object of the present invention to provide an group III-V compound semiconductor device having an insulating film which is very small in leakage current and high in resistivity.

it is another object of the present invention to provide an $Al_xGa_{1-x}As$ semiconductor device having an MIS structure which has excellent insulating properties and C-V characteristics.

According to one aspect off the present invention, a semiconductor device is provided which has a semiconductor region essentially consisting of $Al_xGa_{1-x}As$ ($0 \leq x \leq 1$) and an insulating film formed on the surface of the semiconductor region and essentially consisting of $GaAs_wP_yO_z$ (w, y, x $\leq$ 0).

An insulating film essentially consisting of $GaAs_wP_yO_z$ formed on a semiconductor region of $Al_xGa_{1-x}As$ provides a very high resistance.

An MIS structure using an insulating film essentially consisting of $GaAs_wP_yO_z$ provides excellent C-V characteristics.

It is possible to form an insulating film showing good interfacial properties on the surface of $Al_xGa_{1-x}As$ ($0 \leq x \leq 1$). By using such a surface insulating film, various semiconductor devices can be manufactured, such as MISFETs of $Al_xGa_{1-x}As$ which have been difficult to realize by conventional techniques.

DETAILED DESCRIPTION OF THE PREFERRED EMBODIMENTS

Figure 1A:
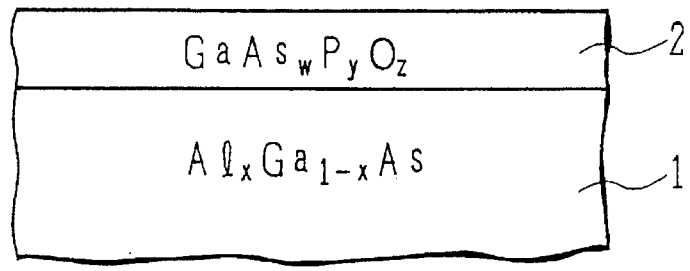
FIGS. 1A to 1C are schematic cross sectional views showing the structures of semiconductor devices according to embodiments off the present invention.
Figure 1B:
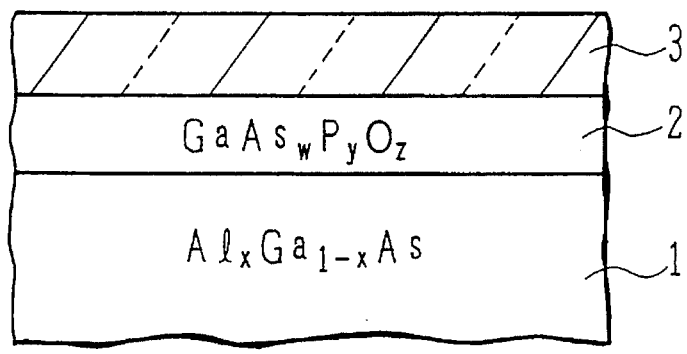
Figure 1C:
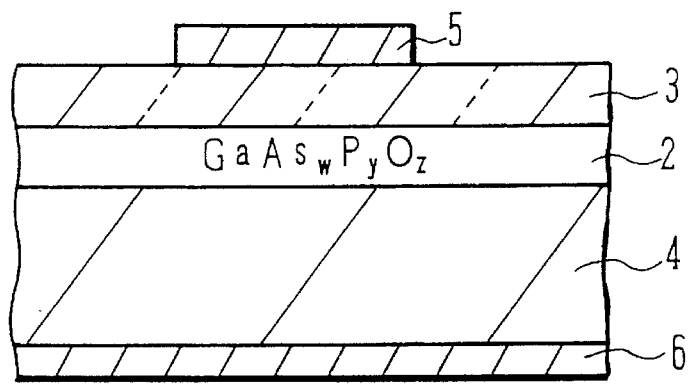

FIGS. 1A to 1C show the fundamental structures of semiconductor devices according to embodiments of the present invention.

In FIG. 1A, a $GaAs_wP_yO_z$ insulating film 2 is formed on an $Al_xGa_{1-x}As$ semiconductor region 1. The $GaAs_wP_yO_z$ insulating film 2 functions as a surface insulating film of the $Al_xGa_{1-x}As$ semiconductor region 1.

In FIG. 1B, a $GaAs_wP_yO_z$ insulating film 2 is formed on an $Al_xGa_{1-x}As$ semiconductor region 1, and a passivation film 3 made of insulating material is formed on the $GaAs_wP_yO_z$ insulating film 2.

The passivation film 3 is made of insulating material such as $SiO_x$, $SiN_x$, $AlO_x$, and $AlN_x$. The passivation film 3 functions as a surface insulating film of the $Al_xGa_{1-x}As$ semiconductor region 1 in cooperation with the $GaAs_wP_yO_z$ insulating film 2, and also has a function of protecting the surface of the $GaAs_wP_yO_z$ insulating film 2.

In FIG. 1C, a $GaAs_wP_yO_z$ insulating film 2 is formed on a semiconductor layer 4, a passivation film 3 is formed on the $GaAs_wP_yO_z$ insulating film 2, and an electrode 5 is formed on the passivation film 3. Another electrode 6 is formed on the bottom surface of the semiconductor layer 4. The semiconductor layer 4 is formed with $Al_xGa_{1-x}As$ at least at the surface thereof.

In this structure, the semiconductor layer 4 and electrode 5 are disposed on opposite sides of an insulating film made of the $GaAs_wP_yO_z$ insulating film 2 and passivation film 3, thus forming a so-called MIS structure. For example, this MIS structure may be used as the insulated gate structure of an MIS field effect transistor (FET).

Next, processes of forming a $GaAs_wP_yO_z$ insulating film on a GaAs substrate will be explained with reference to FIGS. 2A and 2B. In this example, although a $GaAs_wP_yO_z$ insulating film is formed directly on a GaAs substrate, a GaAs substrate having an $Al_xGa_{1-x}As$ layer formed thereon may also be used. Instead of a GaAs substrate, an $Al_xGa_{1-x}As$ substrate may be used if possible.

First, a pre-process and etching process are performed to clean the surface of a GaAs substrate. In the pre-process, the surface is polished by using aluminum powders, and cleaned by organic solvent. For example, trichloroethane, acetone, and methanol are used for ultrasonic cleaning, respectively for three minutes.

After the ultrasonic cleaning with organic solvents, over-flow cleaning with super pure water (18 MΩcm) is performed, and the surface is dried by using a spinner and coated with Apiezon (a wax). Apiezon is used as a mask at the next etching process.

The etching process is performed so as to remove a contaminated surface layer. For example, in this etching process, the substrate is immersed in an etchant of $H_wSO_4:H_2O_2:H_2O=4:1:1$ at a temperature of about 40° C. for one minute.

After the etching process, over-flow cleaning with super pure water, drying, and Apiezon removing are performed. Thereafter, cleaning with organic solvents, over-flow cleaning with super pure water, processing by 5% HCl at 25° C. for five minutes, over-flow cleaning with super pure water, and drying are sequentially performed in this order.

In the above manner, a GaAs substrate with a clean surface is prepared. The above-described pre-process and etching process are only illustrative, and other surface cleaning processes may also be used.

Figure 2A:
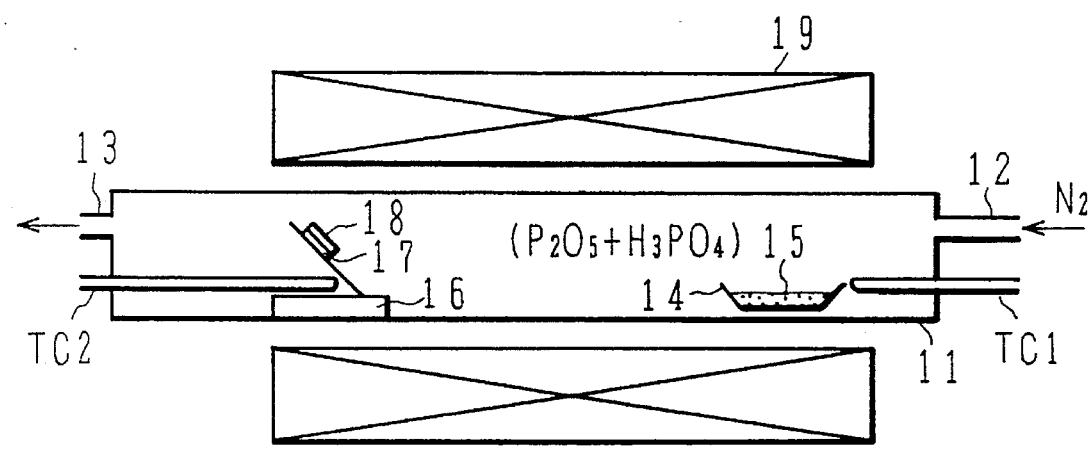
FIGS. 2A and 2B are schematic cross sectional views illustrating the steps of manufacturing a semiconductor device in which a $GaAs_wP_yO_z$ insulating film is formed on an underlying substrate, according to another embodiment of the present invention.

Next, as shown in FIG. 2A, $P_2O_5$ is deposited on the surface of the GaAs substrate. As a source material of $P_2O_5$, $P_2O_5$ and $H_3PO_4$ (phosphoric acid) are mixed together in a paste form and housed in a container 14.

A quartz reaction tube 11 has a gas inlet 12 and a gas outlet 13 at opposite ends of the tube 11. A susceptor 16 is mounted at the inside of the reaction tube 11. The GaAs substrate as an underlying substrate 17 is placed on the susceptor 16. The container 14 with the source material 15 is disposed at an upstream of the susceptor 16. Thermocouples TC1 and TC2 are inserted near to the container 14 and susceptor 16 for in-situ temperature monitoring. The prepared reaction tube 11 is placed in an electric furnace 19.

The inside of the electric furnace 19 has a temperature distribution monotonicly rising from the left to the right. The temperatures at both ends of the electric furnace 19 are obviously lowered.

After the container 14 with the source material 15 is heated up to about 440° C. and the temperature near the susceptor 16 is maintained about 350° C., nitrogen gas as a carrier gas is introduced from the gas inlet 12. $P_2O_5$ vaporized from the source material 15 is transported by the nitrogen gas and deposited on the underlying substrate 17 to form a deposition film 18.

The $P_2O_5$ deposition film 18 is chemically unstable. In order to stabilize this film, a heat process in an $O_2$ atmosphere is performed in the same reaction tube as shown in FIG. 2B.

Figure 2B:
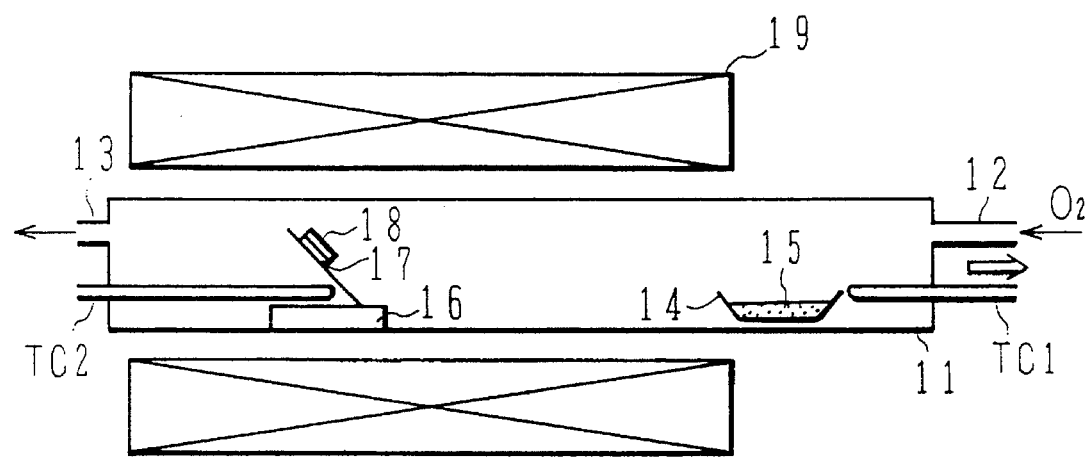

As seen from in FIG. 2B, the reaction tube 11 is moved to the right so that the container 14 with the source material 15 is exposed to the outside of the electric furnace 19 so as to lower the temperature of the container 14. The underlying substrate 17 on the susceptor 16 is maintained at a temperature of about 350° C.

Oxygen gas is introduced from the gas inlet 12 to thermally process the deposited film 18 on the underlying substrate 17 in an oxygen atmosphere. The period of the heat process is, for example, 30 minutes. This heat process in an oxygen atmosphere supplies sufficient oxygen and chemically stabilizes the deposition film 18.

Next, the reaction tube 11 is moved further to the right so that the susceptor 16 is maintained at a temperature of about 420° C. Under this condition, nitrogen gas is introduced from the gas inlet 12 to perform a heat process in a nitrogen gas atmospheric. The period of the heat process is, for example, 30 minutes.

These heat processes improves the dielectric properaties of the deposition film 18 and make the film 18 dense. The deposition film 18 chemically stabilized is mechanically stable. The two heat processes accelerate the reaction between the deposition film 18 and underlying substrate 17, and the composition of the deposition film 18 essentially consisting of $P_2O_5$ has been changed to $GaAs_wP_yO_z$.

With the above processes, a $GaAs_wP_yO_z$ insulating film can be formed on a GaAs substrate. The $GaAs_wP_yO_z$ insulating film may by formed by other processes. For example, sputtering, chemical vapor deposition (CVD), or the like may be used.

An excellent interface between a GaAs substrate and a $GaAs_wP_yO_z$ film can be obtained by forming the $GaAs_wP_yO_z$ film on the GaAs substrate. The $GaAs_wP_yO_z$ film formed in the above manner may be used alone. However, in order to protect the surface of the $GaAs_wP_yO_z$ film and further improve the insulation performance, a passivation film made of different insulating material is formed on the surface of the $GaAs_wP_yO_z$ film.

For example, after the $GaAs_wP_yO_z$ film is formed, the substrate is placed at the inside of a vacuum evaporation apparatus and $SiO_x$ is deposited. In this case, the thickness of the $SiO_x$ film is set to, for example, about 60 to 70 nm. The average value for x is $1 \leq x \leq 2$. This value is not critical, but may take a desired value so long as it ensures surface protection.

After the $SiO_x$ film is deposited, a heat process in an oxygen atmosphere is performed. This heat process in an oxygen atmosphere is performed, for example, at a substrate temperature of about 385° C. for 30 minutes.

A laminated insulating film of a $GaAs_wP_yO_x$ film and $SiO_x$ film formed in the above manner was used for forming an MIS structure. The characteristics of such MIS structure were measured.

Figure 3A:
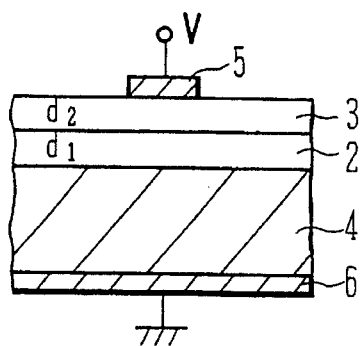
FIGS. 3A to 3C are a cross sectional view showing the structure of a test sample and graphs showing the characteristics of the sample.

As shown in FIG. 3A, an aluminum gate electrode 5 having a diameter of 1 mm was formed on the passivation film 3 formed on a GaAs$_w$P$_y$O$_x$ film 2. A counter ohmic electrode 6 made of AuGe or AuZn was formed on the bottom surface of the GaAs substrate 4. The total thickness of the GaAs$_w$P$_y$O$_x$ film 2 and SiO$_x$ film 3 was 150 nm. An n-type substrate having the (1 0 0) plane was used as the GaAs substrate 4.

Figure 3B:
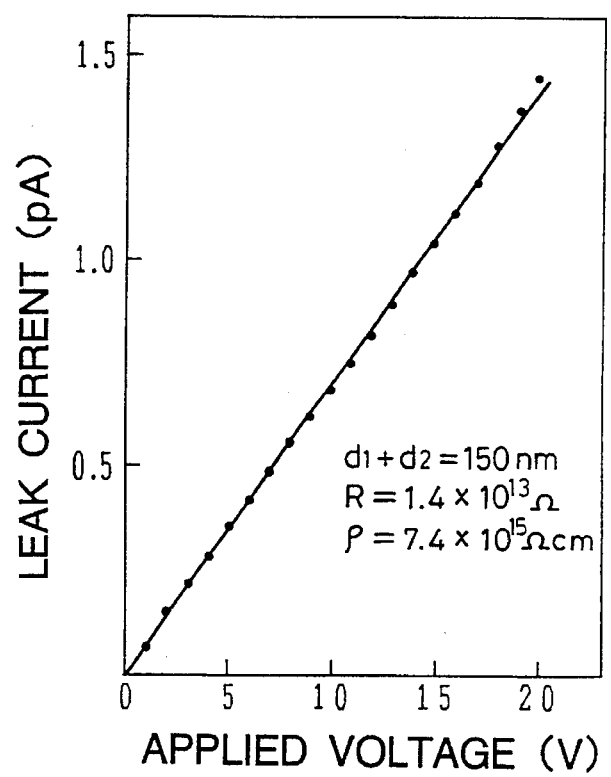

FIG. 3B shows the current-voltage (I-V) characteristics of the test sample formed in the above manner. The abscissa represents an applied voltage in V (volt), and the ordinate represents a leakage current in pA. As the applied voltage was increased, the leakage current I increased substantially linearly. For example, at an applied voltage of 18 V, the leakage current I took a very small value at about 1.26 pA.

The resistance value R calculated from the I-V characteristics showed about $1.4 \times 10^{13}$ Ω. The resistivity ρ of the deposited insulating film calculated from the resistivity R showed about $7.4 \times 10^{15}$ Ωcm which is a value sufficiently large for an insulating film of an MIS structure.

Figure 3C:
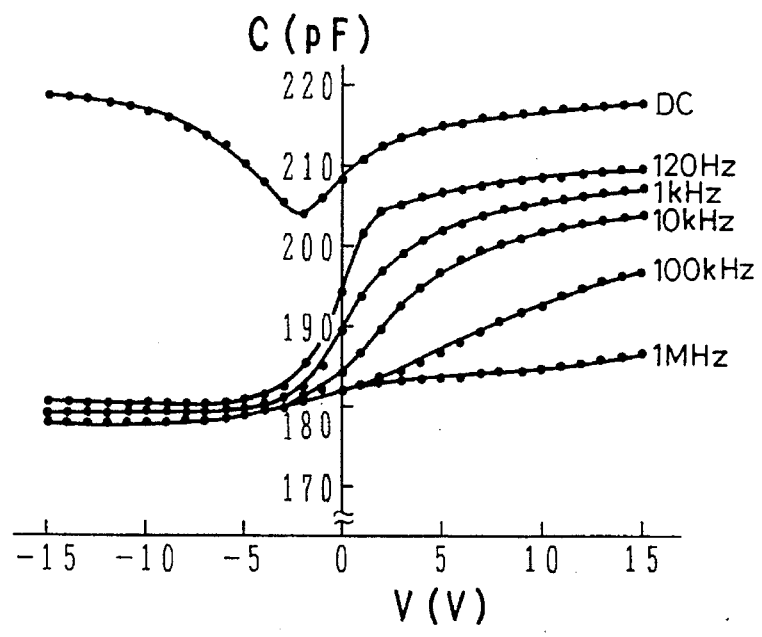

FIG. 3C shows the C-V characteristics of the same sample. The abscissa represents an applied voltage V, and the ordinate represents a capacitance C in units of pF. The frequency of the applied voltage was changed stepwise from near DC to a high frequency of 1 MHz. The applied voltage was changed in the range from +15 V at the accumulation band to -15 V at the inversion band.

As seen from the C-V characteristics of FIG. 3C, particularly from the DC characteristic, an inversion was formed which has been rarely had on the surface of a GaAs substrate. It is therefore obvious that the interface state was properly controlled.

A hysteresis of the C-V characteristic at DC was smaller than 0.1 V and was difficult to observe. It was also found from the curve at the inversion band that the frequency characteristic was good.

An excellent interface with a less number of interface states can be realized by forming a GaAs$_w$P$_y$O$_x$ film on the surface of GaAs. In the foregoing explanation, a GaAs$_w$P$_y$O$_x$ film is formed on a GaAs semiconductor region. This film may be formed on the surface of Al$_x$Ga$_{1-x}$As having properties similar to GaAs, particularly having $x \leq 0.4$, providing substantially the same interface state.

Figure 4A:
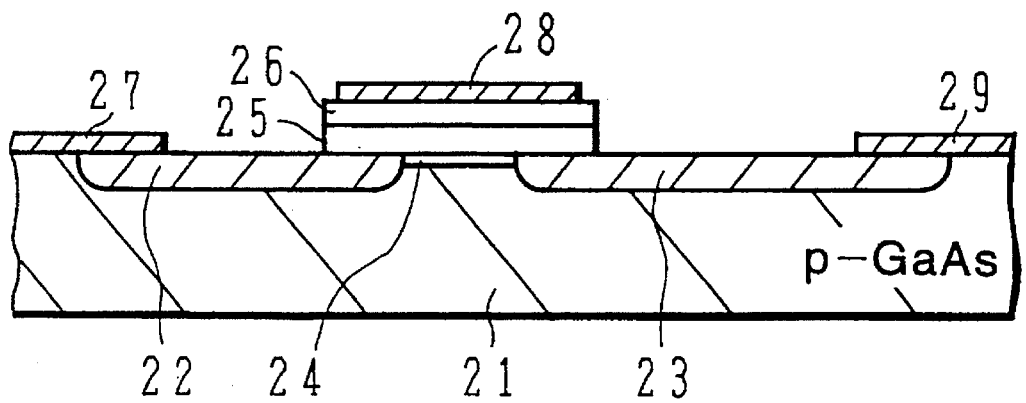
FIGS. 4A and 4B are schematic cross sectional views showing the structures of semiconductor devices according to other embodiments of the present invention.
Figure 4B:
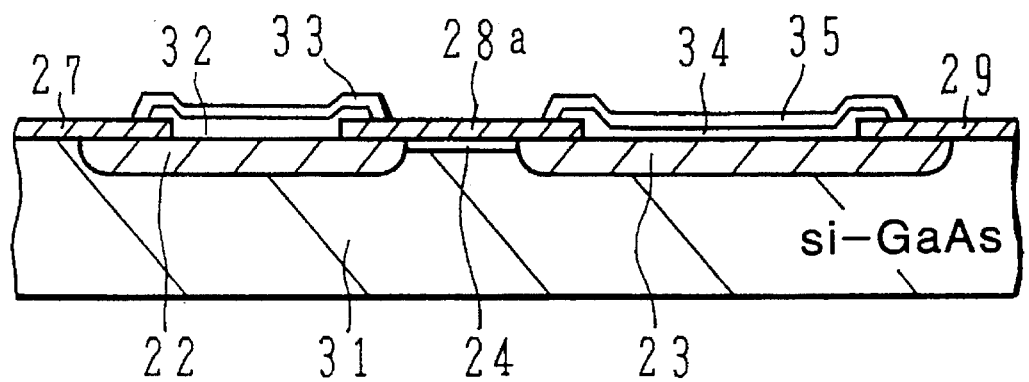
Figure 5A:
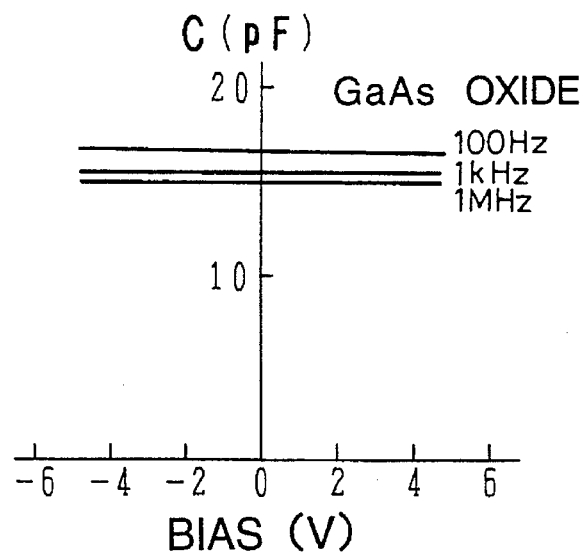
FIGS. 5A and 5B are graphs showing the characteristics of GaAs oxide films manufactured by conventional techniques.
Figure 5B:
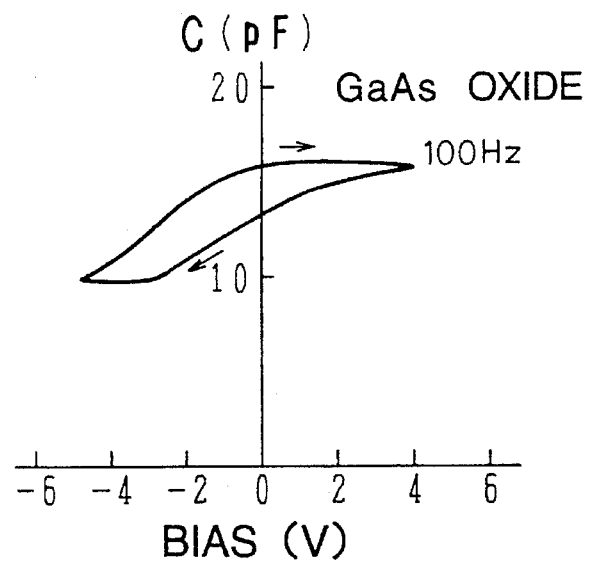

FIGS. 4A and 4B show examples of the structures of semiconductor devices having GaAs$_w$P$_y$O$_x$ films according to embodiments of the present invention. FIG. 4A shows the structure of a GaAs MISFET, and FIG. 4B shows the structure of a GaAs MESFET. In place of the GaAs layer, an Al$_x$Ga$_{1-x}$As layer may be used as the channel layer.

Referring to FIG. 4A, n$^+$-type regions 22 and 23 are formed on the surface of a p-type GaAs substrate 21 to define the channel region 24 therebetween. A GaAs$_w$P$_y$O$_x$ insulating film 25 and an SiO$_x$ passivation film 26 are laminated covering the surface of the channel region 24, to thus form a gate insulating film.

Source and drain electrodes 27 and 29 are formed on the n$^+$-type regions 22 and 23 for the ohmic-contact therewith. A gate electrode 28 is formed on the SiO$_x$ passivation film of the gate insulating film. Ohmic contact electrodes may be a laminated layer of AuGe/Au or the like. The gate electrode 28 may be the same material as the ohmic electrodes, or other metals such as Al or semiconductor.

As a positive polarity voltage is applied to the gate electrode 28, holes in the channel region 24 are expelled. As the voltage is increased, the channel region 24 is inverted to an n-type. Under this condition, a path between the n$^+$-type regions 22 and 23 functioning as the source and drain is made electrically conductive.

As explained earlier, the interface between the GaAs$_w$P$_y$O$_x$ film 25 and GaAs substrate has quite a small number of interface states (traps) so that the surface state of GaAs can be efficiently controlled by the gate voltage, thereby allowing to form an excellent GaAs MISFET.

Referring to FIG. 4B showing an example of the structure of a GaAs MESFET, n$^+$-type regions 22 and 23 are formed on the surface of a high resistance GaAs substrate 31 to define a channel region 24 therebetween.

A gate electrode 28a made of Al or the like is formed directly on the channel region 24 for the Schottky contact therewith. Source and drain electrodes 27 and 29 are formed on the n$^+$-type regions 22 and 23 for the ohmic-contact therewith. A laminated layer of GaAs$_w$P$_y$O$_x$ insulating films 32 and 34 and SiO$_x$ passivation films 33 and 35 is formed on the surface of the exposed GaAs.

The laminated layer of GaAs$_w$P$_y$O$_x$ film and SiO$_x$ passivation film functions as a surface passivation film. The operation of this GaAs MESFET is generally the same as that of the GaAs MISFET shown in FIG. 4A.

Semiconductor devices of MISFETs and MESFETs have been described above. It is obvious to those skilled in the art that various other semiconductor devices may be realized. For example, In$_x$Ga$_{1-x}$As ($0 < x \leq 0.3$) may be used in place of GaAs. The interface state of In$_x$Ga$_{1-x}$As is expected not worse than that of GaAs. Instead of the laminated layer of GaAs$_w$P$_y$O$_x$ film and SiO$_x$ passivation film, a single layer of the GaAs$_w$P$_y$O$_x$ film may be used. Instead of the SiO$_x$ passivation film, other passivation films made of different materials may also be used.

The present invention has been described in connection with the preferred embodiments. The invention is not limited only to the above embodiments. It is apparent for those skilled in the art that various modifications, substitutions, combinations and the like can be made without departing from the scope of the appended claims.

We claim:

1. A semiconductor device comprising:
   a Al$_x$Ga$_{1-x}$As ($0 < x \leq 1$) semiconductor region; and
   a GaAs$_w$P$_y$O$_z$ (w, y, z > 0) insulating film formed on the surface of the semiconductor region.

2. A semiconductor device according to claim 1, further comprising a passivation film formed on the insulating film.

3. A semiconductor device according to claim 2, wherein the passivation film is a SiO$_x$ ($x \geq 1$) film.

4. A semiconductor device according to claim 2, further comprising a conductive electrode formed on the passivation film.

5. A semiconductor device according to claim 4, wherein the Al$_x$Ga$_{1-x}$As ($0 < x \leq 1$) semiconductor region includes source and drain regions having a low resistivity on opposite sides of the conductive electrode to form a field effect transistor.

6. A semiconductor device according to claim 1, further comprising a conductive electrode formed on the insulating film.

7. A semiconductor device according to claim 6, further comprising a pair of conductive regions formed in the Al$_x$Ga$_{1-x}$As ($0 < x \leq 1$) semiconductor region on opposite sides of the electrode.

8. A semiconductor device according to claim 7, wherein the conductive regions and the semiconductor region have opposite conductivity types.

9. A semiconductor device according to claim 1, wherein said x is in the range of $0 < x \leq 0.4$.

10. A semiconductor device according to claim 9, further comprising a conductive electrode formed on the insulating film.

11. A semiconductor device according to claim 10, further comprising a pair of conductive regions formed in the $Al_xGa_{1-x}As$ ($0 < x \leq 1$) semiconductor region on opposite sides of the conductive electrode.

12. A semiconductor device according to claim 11, wherein the conductive regions and the semiconductor region have opposite conductivity types.

13. A semiconductor device comprising:

an $In_xGa_{1-x}As$ ($0 < x \leq 0.3$) semiconductor region; and a $GaAs_wP_yO_z$ (w, y, z>0) insulating film formed on the surface of the semiconductor region.

14. A semiconductor device comprising:

an $In_xGa_{1-x}As$ ($0 < x \leq 0.3$) semiconductor region; and an insulating film on a surface of the semiconductor region formed by the reaction of said $In_xGa_{1-x}As$ with $P_2O_5$.

15. A semiconductor device comprising:

GaAs semiconductor region;

a $GaAs_wP_yO_z$ (w, y, z>0) insulating film formed on the surface of the semiconductor region; and a passivation film formed on the insulating film.

16. A semiconductor device according to claim 15, wherein the passivation film is a $SiO_x$ ($x \leq 1$) film.

* * * * *